United States Patent [19]

Simko

[11] 4,119,995
[45] Oct. 10, 1978

[54] ELECTRICALLY PROGRAMMABLE AND ELECTRICALLY ERASABLE MOS MEMORY CELL

[75] Inventor: Richard T. Simko, Los Altos, Calif.

[73] Assignee: Intel Corporation, Santa Clara, Calif.

[21] Appl. No.: 778,574

[22] Filed: Mar. 17, 1977

Related U.S. Application Data

[63] Continuation-in-part of Ser. No. 716,790, Aug. 23, 1976, abandoned.

[51] Int. Cl.² .............................................. H01L 29/78
[52] U.S. Cl. ........................................ 357/23; 357/15; 357/41; 357/54; 357/59
[58] Field of Search ....................... 357/23, 15, 41, 54, 357/59

[56] References Cited

U.S. PATENT DOCUMENTS

| | | |
|---|---|---|
| 3,755,721 | 8/1973 | Frohman-Bentchkowsky ...... 357/23 |
| 3,825,945 | 7/1974 | Masuoka ................................ 357/23 |
| 3,996,657 | 12/1976 | Simko ..................................... 357/23 |

OTHER PUBLICATIONS

1972 Wescon Tech. Papers — vol. 16, pp. 2–8.

Primary Examiner—Edward J. Wojciechowicz
Attorney, Agent, or Firm—Blakely, Sokoloff, Taylor & Zafman

[57] ABSTRACT

An MOS memory cell which includes a floating gate charged from the substrate by avalanche injection. Charge is removed from the floating gate to an erasing gate by tunneling. Sharp edges on the polycrystalline silicon floating gate provide an enhanced electric field to overcome the silicon/silicon oxide barrier, thus permitting charge to be transferred from the floating gate to the erasing gate.

12 Claims, 7 Drawing Figures

ELECTRICALLY PROGRAMMABLE AND ELECTRICALLY ERASABLE MOS MEMORY CELL

This application is a continuation-in-part application of Ser. No. 716,790, filed Aug. 23, 1976, now abandoned.

BACKGROUND OF THE INVENTION

1. Field of the Invention

The invention relates to the field of MOS storage devices, particularly those employing floating gates.

2. Prior Art

Metal-oxide-semiconductor (MOS) storage devices which employ floating gates are known in the art. Some of these devices use tunneling to transfer charge from the substrate to the floating gate. (See U.S. Pat. No. 3,500,142) These devices require a relatively thin oxide between the floating gate and the substrate (e.g. 50Å). This thin oxide is not only difficult to fabricate, but also prevents long term storage. Other floating gate storage devices employ avalanche injection to transport charge from the substrate to the floating gate. One such device is disclosed in U.S. Pat. No. 3,660,819. For this device a relatively thick oxide is employed to separate the floating gate from the substrate (e.g. 1,000Å), making this device practical to fabricate and capable of providing long term storage. This latter device is commercially employed in electrically programmable read-only memories. Charge is removed from these devices by subjecting them to ultraviolet radiation.

Numerous devices have been proposed which permit electrical removal of charge from a floating gate by avalanche injection and other phenomena. This removal permits the storage device to be both electrically programmed and erased. Such floating gate devices including devices which employ two other gates are disclosed in U.S. Pat. No. 3,825,946. In copending application Ser. No. 613,130, filed Sept. 15, 1975, now abandoned, entitled "Electrically Programmable and Erasable MOS Device" and assigned to the assignee of this application, a device is described which is electrically erased by avalanche injection. This MOS device includes n-type source and drain regions disposed in a p-type substrate, and a p-type polycrystalline silicon floating gate. A control gate is also employed for charging and discharging the floating gate.

Tunneling has not been employed in the prior art in practical storage devices for removing charge from a floating gate. Tunneling either required too thin an oxide, or too high a potential. The present invention employs tunneling for discharging a floating gate through a relatively thick oxide, without a high potential.

In U.S. Pat. No. 3,996,657, a double self-aligned method is described for forming the source and drain regions of a floating gate device while doping the gates. Through a predeposition step a lightly doped secondary source and drain region are formed in alignment with the floating gate prior to the formation of the primary source and drain region in alignment with the second gate. The process described in this patent is employed for fabricating the device of the present invention with one significant variation as will be described.

SUMMARY OF THE INVENTION

An electrically programmable and erasable MOS device fabricated on a silicon substrate is described. A channel is defined in the substrate by spaced-apart source and drain regions. A floating gate is disposed above this channel. A first gate which is formed above the channel and the floating gate, is used for injecting charge into the floating gate. A second gate is formed over at least a portion of the floating gate. The floating gate has an uneven surface (rough texture) to provide an enhanced electric field between the floating gate and the second gate such that electrons from the floating gate may be transferred to the second gate when a potential is applied to the second gate.

DETAILED DESCRIPTION OF THE INVENTION

An electrically programmable and electrically erasable MOS storage device and cell are described. In the following description, the presently preferred embodiment is described including the presently preferred layout of the memory cells in an array, illustrated in FIG. 4. Alternate embodiments and variations of the described device, employing the inventive concepts, will be obvious to one skilled in the art.

Figure 1:
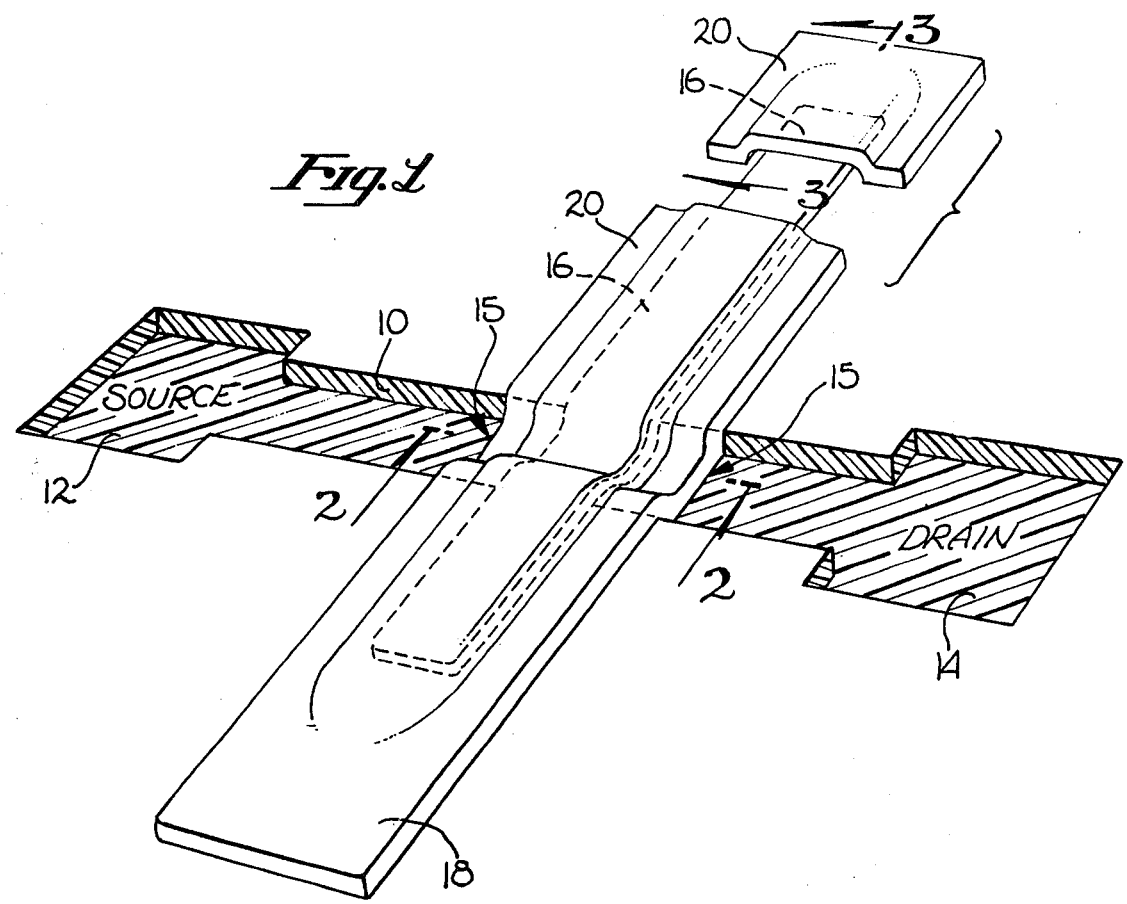
FIG. 1 is a perspective view of the MOS storage device of the present invention.
Figure 2:
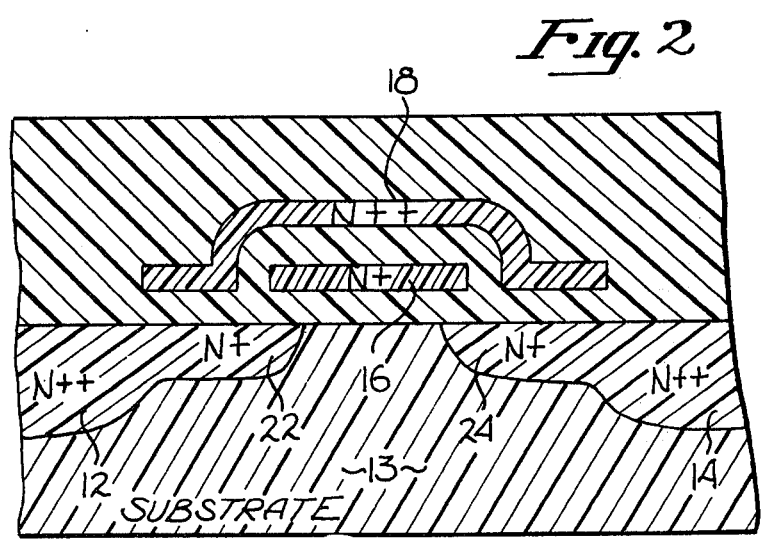
FIG. 2 is a partial cross-sectional elevation view of the device of FIG. 1 taken through section lines 2—2 of FIG. 1.
Figure 3:
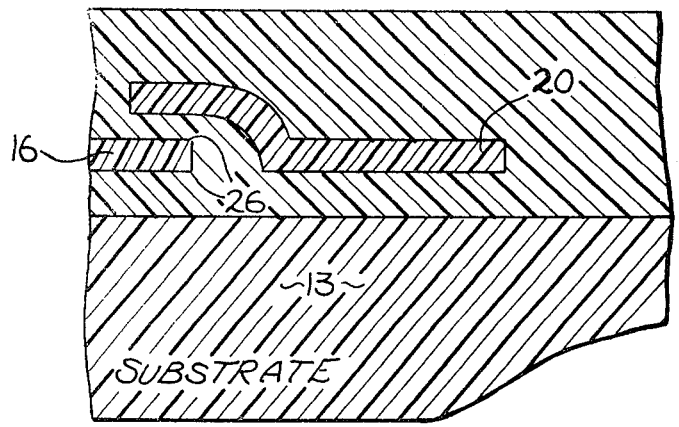
FIG. 3 is a partial cross-sectional elevation view of the device of FIG. 1 taken through section line 3—3 of FIG. 1.

Referring to FIGS. 1, 2 and 3, in the presently preferred embodiment the memory device is an n-channel device fabricated on a p-type silicon substrate. The substrate is doped to an impurity level of approximately $2 \times 10^{15}$ atoms/cm$^3$; the upper surface of the substrate is ion implanted (boron implanted) to raise the impurity level by an order of magnitude to approximately $2$–$5 \times 10^{16}$ atoms/cm$^3$. This ion implanted area forms the host region for the memory devices and cells. When a memory array is fabricated on the substrate, the nonion implanted areas may be employed for the peripheral circuits. (The ion implanted region which forms the host region for the memory devices is not illustrated in the drawings.) The memory devices, of course, may be fabricated on a substrate where the entire substrate is doped to a concentration level of approximately $2$–$5 \times 10^{16}$ atoms/cm$^3$.

In the perspective view of FIG. 1 the spaced-apart source region 12 and drain region 14 of the memory device are surrounded by an oxide 10. Note in this view oxide layers associated with the memory device including the oxide layer above the source and drain regions are not shown in order to more clearly illustrate the device. The source and drain regions define an elongated channel 15. A floating gate 16 which is an elongated polycrystalline silicon member is disposed generally transverse to the channel 15. This floating gate which is used to store charge, is insulated from the substrate, as best illustrated in FIG. 2, by approximately 1100Å of thermally grown oxide. The edges 26 (FIG. 3) and the general surface of gate 16 are maintained sharp and rough by processing steps which will be described, and for reasons which will be discussed.

A generally elongated programming gate 18 is fabricated over the floating gate 16 and the channel 15. This polycrystalline silicon member, as best seen in FIG. 2, is insulated from the floating gate 16 by an oxide layer approximately 1000 to 1300Å thick.

An erasing gate 20 which is spaced-apart from the programming gate 18 is disposed over one end of the floating gate 16 (FIG. 3). This gate is smaller than the programming gate 18 as will be described. The gate 20 is fabricated from polycrystalline silicon and is insulated from the floating gate 16 by approximately 1000 to 1300Å of oxide.

Contacts are provided to the source and drain regions, programming gate 18, and erasing gate 20; these contacts are not shown in FIGS. 1, 2 or 3.

Referring again to FIGS. 1, 2 and 3, after the above mentioned ion implantation, the substrate may be prepared to receive the memory devices by employing any one of a plurality of well-known "front end" steps including the formation of field oxides such as the field oxide 10 shown in FIG. 1. A first layer of polycrystalline silicon which is etched to form the floating gate 16, is first formed on the substrate above a thermally grown oxide. In the presently preferred embodiment, as mentioned, this oxide is approximately 1100Å thick. Ordinary photolithographic techniques may be employed to define the floating gate 16.

Following the formation of the floating gate 16, an n-type dopant is diffused into the substrate in alignment with the floating gate 16. An ordinary diffusion step may be employed for this purpose or ion implantation may be used. In the presently preferred embodiment a relatively light predeposition is employed at a temperature of approximately 750° C. to 800° C. This relatively light doping forms the secondary source region 22 and secondary drain region 24 shown in FIG. 2 and dopes the floating gate 16.

Now a thermally formed oxide layer is deployed above the first layer of polycrystalline silicon which silicon layer includes the floating gate. This oxide layer, as previously mentioned, is approximately 1000 to 1300Å thick, in the presently preferred embodiment. A second layer of polycrystalline silicon is then formed on this oxide layer and etched to define both the programming gate 18 and the erasing gate 20. Again, ordinary photolithographic techniques may be employed to form these gates.

The substrate is next subjected to an ordinary diffusion step employing an n-type dopant to form the source region 12 and drain region 14. This diffusion occurs in alignment with the gate 18. In the presently preferred embodiment, this doping occurs in a predeposition furnace at a temperature of approximately 950° C.

Ordinary MOS processing steps may now be employed to complete the device including the formation of a protective glass layer, metal contacts and other well-known processing steps.

As previously mentioned the process employed to fabricate the storage device of the present invention is described in more detail in U.S. Pat. No. 3,996,657.

However, there is one significant difference in the processing described in this prior application and that employed to fabricate the device of the present application. Specifically, in the prior application the first layer of polycrystalline silicon which layer is employed to form the floating gate, is heavily doped with an n-type dopant (phosphorus) prior to etching. This doping step is not employed in the present invention. If the first layer of polycrystalline silicon is not heavily doped with the phosphorus dopant, its edges remain sharp and its surfaces remain rough even after subsequent oxidations. The sharp edges and rough surfaces of this gate are employed to enhance the electric field between the erasing gate 20 and the floating gate 16, as will be described.

The floating gate 16 of FIG. 1 is in one of two states when programmed. In one state, the floating gate 16 is negatively charged, that is, the gate includes an excess of electrons. In the other state, the floating gate 16 lacks electrons, that is, the gate has a net positive charge. When the device is first fabricated the gate is substantially neutral, that is, its net charge is zero. For this condition the threshold voltage of the device is approximately 4 volts when this positive potential is applied to both the programming gate and the erasing gate. If the erasing gate is held at ground potential, then the threshold voltage is increased to approximately 5 volts. If the programming gate is held at zero volts and a potential is applied to the erasing gate, the threshold voltage for the device is approximately 19 volts. While the device is not operated with a neutral floating gate, these threshold voltages provide the floating gate capacitance coupling ratios for the device.

To place a negative charge on the floating gate 16 a positive potential of approximately 20 volts is applied to the drain terminal, and a potential of approximately 25 volts is applied to both the programming gate and the erasing gate. These potentials may be in the form of ramps or pulses. The source and bulk terminals of the device are grounded when charging the floating gate and for all operations. When these conditions are met the device is in saturation and a large depletion region or layer exists beneath the inversion layer. Hot electrons from the depletion layer at the pinch-off point penetrate the oxide layer separating the floating gate and the substrate and become trapped in the floating gate. When the floating gate is negatively charged the device has a threshold voltage of approximately +10 volts.

To erase the floating gate, the drain terminal, source terminal, and programming gate are held at ground potential while a positive pulse, pulse train or ramp of approximately thirty volts is applied to the erasing gate. This positive potential causes electrons from the floating gate to flow to the erasing gate, leaving the floating gate with a net positive charge. For this erase condition, the storage device has a threshold voltage of approximately −10 volts.

As may be seen from FIG. 1, and from the previous discussions, the programming gate is substantially larger than the erasing gate. During erasing, the programming gate is held at zero potential. Most of the potential applied to the erasing gate appears between the floating gate and the erasing gate. By way of example, of the thirty volts applied to the erasing gate for erasing, approximately 25 volts appears between these two gates. With an oxide thickness between these gates and 1300Å, an average approximate electric field of 1.0

$\times 10^{+6}$ volts/cm results. This field is not sufficient to overcome the silicon/silicon oxide barrier. However, the electric field is substantially enhanced by the sharp edges and rough surfaces of the gate 16. This enhancement is sufficient to cause the electrons to move into the oxide conduction band. Once the electrons are into the conduction band, a much lower electric field is required to sustain the conduction.

Figure 6:
FIG. 6 is a partial cross-sectional elevation view of the floating gate and first gate taken with a scanning electron microscope (magnification of 38,000).
Figure 7:
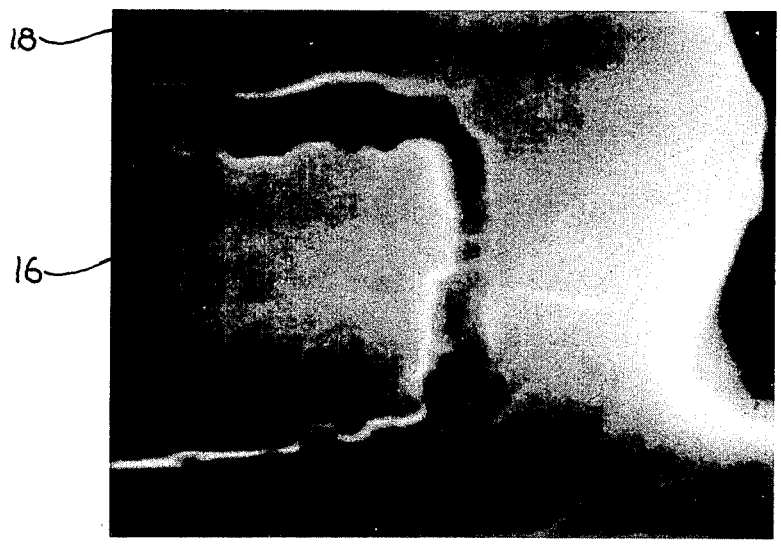
FIG. 7 is a partial cross-sectional elevation view of the floating gate and first gate taken with a scanning electron microscope (magnification of 108,000).

In the scanning electron microscope photograph of FIG. 6 the floating gate 16 and the overlying gate 18 are clearly seen. A closer view of these gates is shown in FIG. 7; note that this view is taken from the opposite side of these gates. In FIG. 7 the rough surface and sharp edges of gate 16 are visible. The surface and edges of gate 16 have many random undulations with radii of curvature of approximately 50Å (ranging from 25Å to 75Å). It is somewhat difficult to see these curvatures in FIG. 7; note in examining FIG. 7 that a scale may be established since the gates are separated by approximately 1000Å. (This rough surface provides a "diode effect". Conduction starts to occur at 8 volts with one polarity between these gates and 20 volts with the opposite polarity.)

Figure 5:
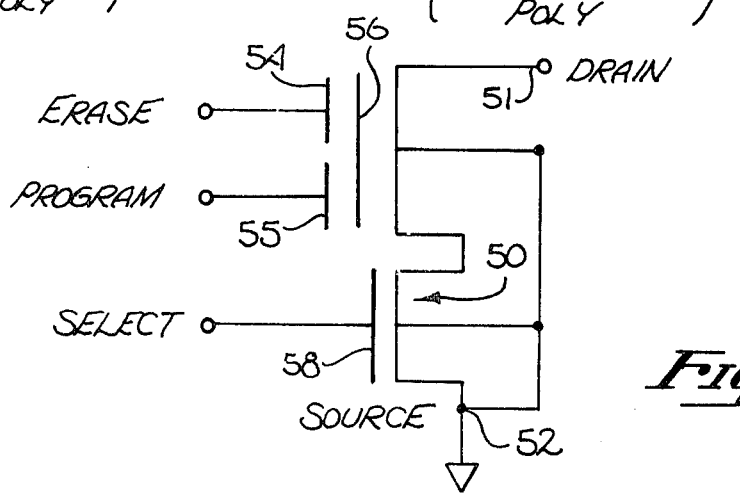
FIG. 5 is an equivalent circuit for a memory cell employing the invented storage device.

As may be seen from the above description, the storage device has a negative threshold when the net charge on the gate is positive. When the storage device is employed in a memory array it is necessary at times that no conduction path exists through the memory cell, to permit interrogation or reading of neighboring devices. A negative potential could be employed to prevent the devices from conducting, however, it is impractical to decode a negative potential for this n-channel embodiment. Rather a selection transistor is coupled in series with each of the storage devices to form a cell. The memory cell of FIG. 5 includes the storage devices to form a cell. The memory cell of FIG. 5 includes the storage device of FIGS. 1 through 3 coupled in series with a selection transistor 50. The storage device in FIG. 5 includes a floating gate 56, erase gate 54, and the programming gate 55. In the presently preferred embodiment the selection transistor 50 includes a polycrystalline gate 58 which is simultaneously defined along with the floating gate 56. During the programming and erasing of the memory cell of FIG. 5 a positive potential (for example 25 volts) is applied to the gate 58 to assure coupling between the drain terminal 51 and source terminal 52. When the cell is interrogated a potential of approximately 8 volts is applied to the gate 58, approximately 4 volts to the gates 54 and 55, and the drain is coupled to a potential of approximately 3 volts. If during interrogation conduction occurs between the drain and source terminals the net charge on the floating gate is positive, if no conduction occurs the net charge on the floating gate is negative.

Figure 4:
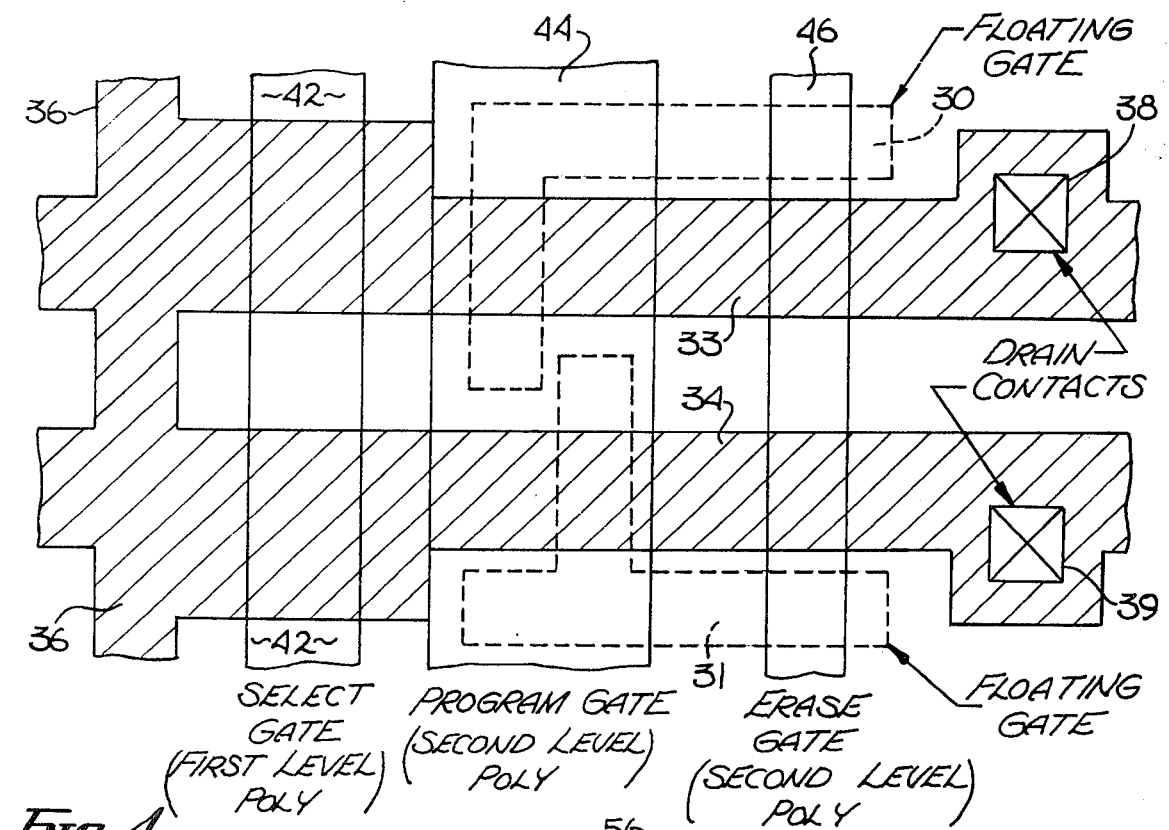
FIG. 4 is a plan view illustrating the presently preferred layout of the invented storage device when such devices are employed in a memory array.

In utilizing the storage device of FIG. 1 in a memory array it may be desirable to arrange the device in a different manner than that shown in FIG. 1. For example the floating gates 16 may be formed with right angles to permit a convenient layout. In FIG. 4 the two adjacent memory cells include a common source region or line 36 and separate drain contacts 38 and 39. Channels 33 and 34 connect each of the drain regions with the common source region 36. An elongated polycrystalline silicon line 42 which extends over channels 33 and 34, is employed as the gate for the selection transistors. Thus the strip 42 corresponds to gate 58 of FIG. 5. A second elongated polycrystalline silicon strip 44 which is parallel to the strip 42 serves as the programming gates for the cells of FIG. 4. This strip corresponds to the gate 55 of FIG. 5. A third, narrower, polycrystalline silicon strip 46 which is parallel to strips 42 and 44, also extends over each of the channels and serves as the erasing gates, such as gate 54 of FIG. 5. One of the floating gates 30 of FIG. 4 is an L-shaped member disposed beneath the strip 44 and extending beneath strip 46. The other floating gate 31 is a T-shaped member disposed generally beneath the strip 44 and extending beneath strip 46. By employing the L-shaped floating gate and T-shaped floating gate in adjacent cells a higher density memory is possible. The strips 42, 44, 46 and the drain contacts 38 and 39 are coupled to the decoding circuits and peripheral circuits of the memory.

Thus an MOS storage device has been described which may be electrically programmed and electrically erased. Charge is removed from the floating gate by tunneling. The sharp edges and rough surface of the floating gate are used to enhance an electric field, which field is used to remove the charge from the floating gate.

I claim:

1. An electrically programmable and erasable MOS storage device disposed on a substrate comprising:
   spaced-apart source and drain regions in said substrate defining a channel;
   a floating gate disposed above said channel;
   a first gate disposed above said channel and said floating gate;
   a second gate disposed over at least a portion of said floating gate and spaced-apart from said first gate;
   said floating gate having a surface texture with radii of curvature between 25Å and 75Å for providing an enhanced electric field between said floating gate and said second gate such that electrons from said floating gate may be transferred to said second gate;
   whereby, by the application of potentials to said first gate and said drain region charge may be injected into said floating gate and whereby, by the application of a potential to said second gate charge may be removed from said floating gate.

2. The MOS storage device defined by claim 1 wherein said floating gate comprises polycrystalline silicon.

3. The MOS storage device defined by claim 2 wherein second gate comprises polycrystalline silicon.

4. The MOS storage device defined by claim 1 wherein said floating gate is an L-shaped member.

5. The MOS storage device defined by claim 1 wherein said floating gate is a T-shaped member.

6. In an MOS storage device which includes a floating gate for storing an electrical charge, a first gate employed for including charge into said floating gate and a second gate spaced-apart from said first gate, employed for removing charge from said floating gate; an improvement for enhancing an electric field between said floating gate and said second gate such that charge may be removed from said floating gate comprising:
   a surface texture on said floating gate having radii of curvature between 25Å and 75Å which cause a non-uniform distribution of the electric field between said second gate and floating gate such that regions of high electric field intensity are present;
   whereby charge may be transferred from said floating gate to said second gate.

7. The MOS storage device of claim 6 wherein said floating gate comprises polycrystalline silicon.

8. An electrically programmable and electrically erasable memory array which includes a plurality of memory cells disposed on a silicon substrate comprising:

source and drain regions defining a plurality of generally parallel spaced-apart channels;

a first polycrystalline silicon line disposed transverse to said channels and above said channels, said first line defining gates for selection transistors for said cells;

a second polycrystalline silicon line disposed transverse to said channels and above said channels spaced-apart from said first silicon line, said second line defining programming gates for said cells;

a third pollycrystalline silicon line disposed transverse to said channels and above said channels spaced-apart from said first and second silicon lines, said third line defining erasing gates for said cells;

a plurality of polycrystalline silicon floating gates, one of said gates for each of said cells, each of said floating gates disposed above one of said channels under said second line and extending under said third line;

said gloating gates having a surface texture with radii of curvature between 25Å and 75Å for providing an enhanced electric field between said floating gates and said third line such that electrons from said floating gates may be transferred to said third line;

whereby each of said cells in said array may be electrically charged and electrically erased.

9. The array defined by claim 8 wherein said floating gates include L-shaped gates and T-shaped gates.

10. The array defined by claim 8 wherein said first line and said floating gates are defined by a first silicon layer and wherein said second and third lines are defined by a second silicon layer.

11. The array defined by claim 8 including a drain contact disposed at one end of each of said channels.

12. The array defined by claim 11 wherein said cells employ a common source region.

* * * * *

UNITED STATES PATENT AND TRADEMARK OFFICE
CERTIFICATE OF CORRECTION

PATENT NO. : 4,119,995
DATED : October 10, 1978
INVENTOR(S) : Richard T. Simko

It is certified that error appears in the above-identified patent and that said Letters Patent are hereby corrected as shown below:

| COLUMN | LINE | |
|---|---|---|
| 4 | 68 | Delete "1300A" and insert in its place --1300Å-- |
| 8 | 4 | Delete the word "gloating" and insert in its place the word --floating-- |

Signed and Sealed this

Eighteenth Day of September 1979

[SEAL]

Attest:

LUTRELLE F. PARKER

*Attesting Officer*   *Acting Commissioner of Patents and Trademarks*

REEXAMINATION CERTIFICATE (33rd)

United States Patent [19]

Simko

[11] B1 4,119,995

[45] Certificate Issued Nov. 2, 1982

[54] ELECTRICALLY PROGRAMMABLE AND ELECTRICALLY ERASABLE MOS MEMORY CELL

[75] Inventor: Richard T. Simko, Los Altos, Calif.

[73] Assignee: Intel Corporation, Santa Clara, Calif.

Reexamination Request
No. 90/000,114, Nov. 25, 1981

Reexamination Certificate for:
Patent No.: 4,119,995
Issued: Oct. 10, 1978
Appl. No.: 778,574
Filed: Mar. 17, 1977

Certificate of Correction issued Sep. 18, 1979.

Related U.S. Application Data

[63] Continuation-in-part of Ser. No. 716,790, Aug. 23, 1976, abandoned.

[51] Int. Cl.³ .......................................... H01L 29/78
[52] U.S. Cl. ...357/23; 357/15; 357/41; 357/54; 357/59

[56] References Cited

U.S. PATENT DOCUMENTS 3,728,695   4/1973   Frohman-Bentchkowsky.
3,825,946   7/1974   Frohman-Bentchkowsky.
3,919,711   11/1975  Chou.
4,016,588   4/1977   Ohya et al.
4,087,795   5/1978   Rossler.

OTHER PUBLICATIONS

Ridley, "Mechanism of Electrical Breakdown in SiO₂ Films", *Journal of Applied Physics*, Vol. 46, No. 3, March 1975.

DiMaria et al., "Interface Effects and High Conductivity in Oxides Grown from Polycrystalline Silicon", *Applied Physics Letters*, Vol. 27, No. 9, November 1, 1975.

*Primary Examiner*—Edward J. Wojciechowicz

[57] ABSTRACT

An MOS memory cell which includes a floating gate charged from the substrate by avalanche injection. Charge is removed from the floating gate to an erasing gate by tunneling. Sharp edges on the polycrystalline silicon floating gate provide an enhanced electric field to overcome the silicon/silicon oxide barrier, thus permitting charge to be transferred from the floating gate to the erasing gate.

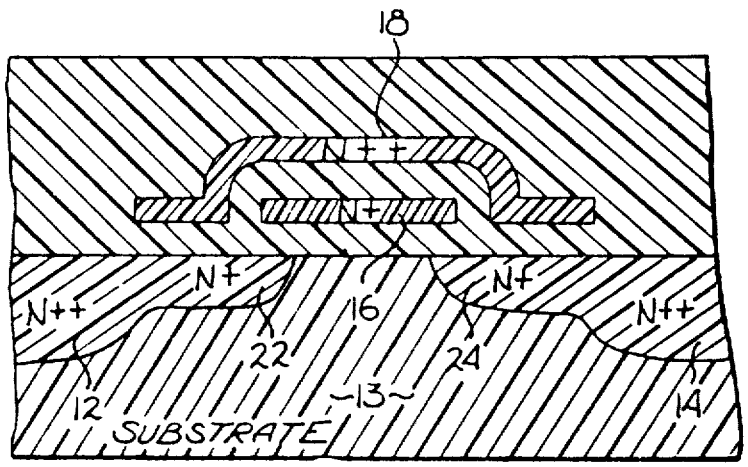

REEXAMINATION CERTIFICATE ISSUED UNDER 35 U.S.C. 307.

NO AMENDMENTS HAVE BEEN MADE TO THE PATENT.

AS A RESULT OF REEXAMINATION, IT HAS BEEN DETERMINED THAT:

The patentability of claims 1–12 is confirmed.

* * * * *